(12) United States Patent
Liao et al.

(10) Patent No.: US 8,002,558 B2
(45) Date of Patent: Aug. 23, 2011

(54) ELECTRICAL CONNECTOR DEFINING PLURALITY OF DISCRETE INTERCONNECTING SECTORS FOR RESPECTIVELY RECEIVING INDIVIDUAL IC PACKAGE THEREON

(75) Inventors: Fang-Jwu Liao, Tu-Cheng (TW); Chun-Yi Chang, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 198 days.

(21) Appl. No.: 12/508,013

(22) Filed: Jul. 23, 2009

(65) Prior Publication Data

US 2010/0291773 A1 Nov. 18, 2010

(30) Foreign Application Priority Data

May 12, 2009 (TW) .............................. 98208096 U

(51) Int. Cl.
*H01R 12/00* (2006.01)
(52) U.S. Cl. .......................................... 439/74; 439/65
(58) Field of Classification Search .................... 439/65, 439/68, 70, 71, 72, 73, 74
See application file for complete search history.

(56) References Cited

U.S. PATENT DOCUMENTS

| | | | |
|---|---|---|---|
| 6,407,566 B1 * | 6/2002 | Brunelle et al. | 324/756.02 |
| 6,971,887 B1 * | 12/2005 | Trobough | 439/71 |
| 7,435,100 B2 | 10/2008 | Chang et al. | |
| 7,517,256 B2 | 4/2009 | Chang | |
| 7,534,133 B2 * | 5/2009 | Hamner | 439/526 |
| 7,686,620 B2 * | 3/2010 | Liao et al. | 439/71 |
| 7,819,669 B2 * | 10/2010 | Liao et al. | 439/66 |
| 2004/0066638 A1 * | 4/2004 | Streltsov | 361/788 |
| 2005/0174744 A1 * | 8/2005 | Zheng | 361/760 |
| 2008/0070454 A1 * | 3/2008 | Chang | 439/883 |
| 2010/0105218 A1 * | 4/2010 | Liao et al. | 439/64 |
| 2010/0130047 A1 * | 5/2010 | Liao | 439/296 |
| 2010/0167562 A1 * | 7/2010 | Polnyi et al. | 439/71 |
| 2010/0178781 A1 * | 7/2010 | Lin et al. | 439/74 |
| 2010/0291773 A1 * | 11/2010 | Liao et al. | 439/66 |

FOREIGN PATENT DOCUMENTS

CN 200720045580.1 9/2008

* cited by examiner

*Primary Examiner* — James Harvey

(74) *Attorney, Agent, or Firm* — Wei Te Chung; Andrew C. Cheng; Ming Chieh Chang

(57) ABSTRACT

An electrical connector for receiving more than one IC packages (3) includes an insulative housing (1) having a planar interface with a plurality of passageways (10) defined therein; and a plurality of contacts (2) retained in the passageways (10) respectively and arranged in more than one groups. Each group of the contacts (2) is incorporated with positioning members (111) that jointly position the IC package upon the group of the contacts (2).

19 Claims, 3 Drawing Sheets

ELECTRICAL CONNECTOR DEFINING PLURALITY OF DISCRETE INTERCONNECTING SECTORS FOR RESPECTIVELY RECEIVING INDIVIDUAL IC PACKAGE THEREON

BACKGROUND OF THE INVENTION

1. Field of the Invention

The present invention relates to an electrical connector, and more particularly to an electrical connector defining a plurality of interconnecting sectors for respectively receiving an individual IC package thereon.

2. Description of Prior Art

Chinese Utility Patent No. 200720045580.1 issued to Liu on Sep. 10, 2008 discloses an electrical connector for interconnecting an IC package and a printed circuit board. The connector includes an insulative housing and a number of contacts received in the housing. The housing features a planar configuration and defines a top surface for supporting the IC package and a bottom surface facing with the printed circuit board. The contacts are retained in corresponding passageways of the housing with contacting arms thereof extending upwardly beyond the top surface of the housing. The housing is further partitioned into four discrete rectangular sections having substantially identical interconnecting area and arranged adjacent with one another. The contacting arms of contacts in diagonal parts extend toward each other to provide balanced force to the IC package.

As the requirement to the performance of a computer system increases, more than one IC packages are required to work together in one computer system so as to meet the requirements. However, the electrical connector in Liu is adapted to only one IC package, thereby can not meet the actual requirements from the customers.

SUMMARY OF THE INVENTION

It is therefore the object of the present invention to provide an electrical connector having more than one interconnecting sectors adapted to receive more than one IC packages thereon.

In accordance with the present invention, an electrical connector for receiving more than one IC packages is provided, which includes an insulative housing having a planar interface with a plurality of passageways defined therein; and a plurality of contacts retained in the passageways respectively and arranged in more than one groups. Each group of the contacts is incorporated with positioning members that jointly position the IC package upon the group of the contacts.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
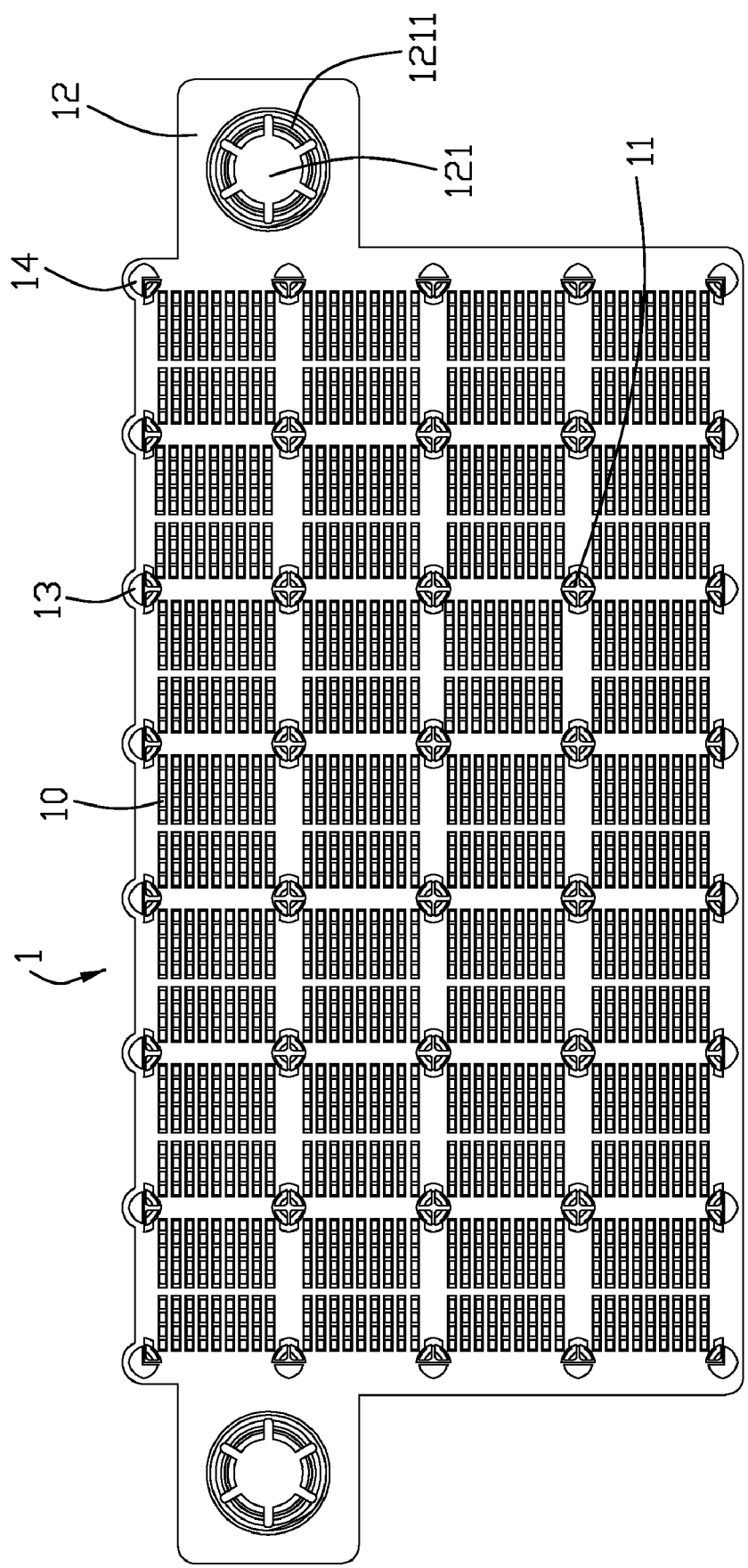
FIG. 1 is a top view of an electrical connector in accordance with a preferred embodiment of the present invention.
Figure 2:
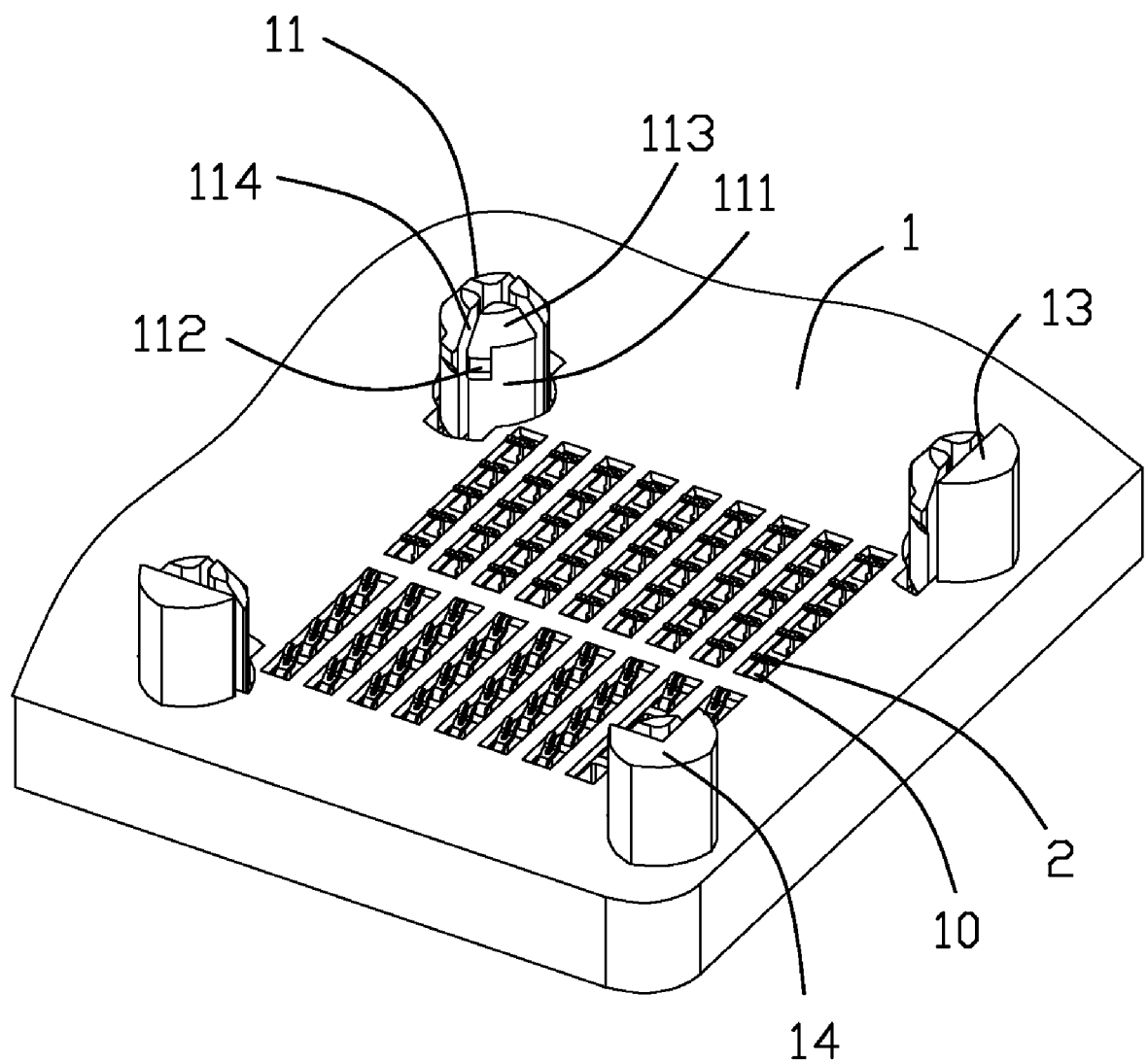
FIG. 2 is a partial assembled, perspective view of the electrical connector in accordance with the preferred embodiment of the present invention.
Figure 3:
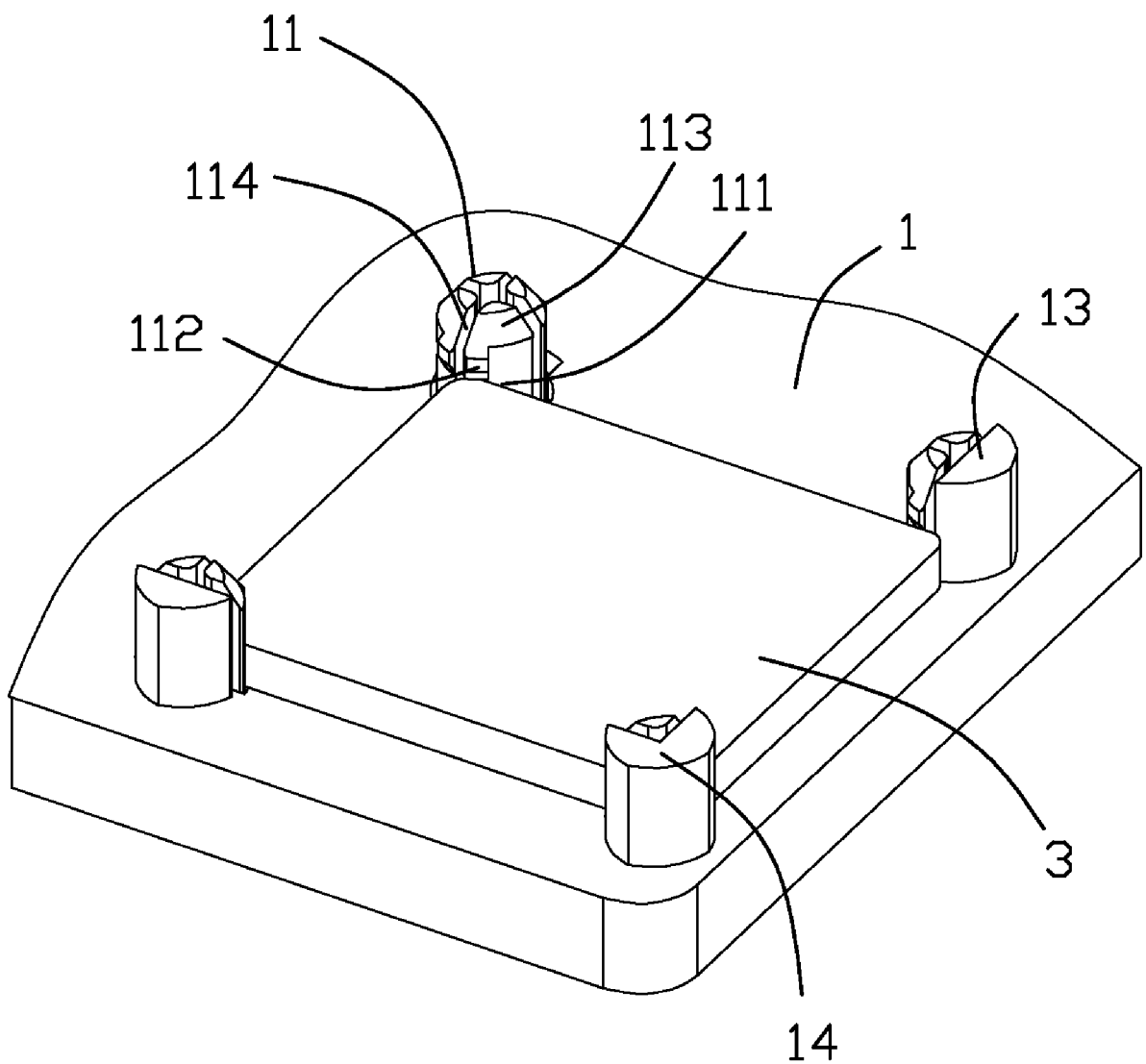
FIG. 3 illustrates an IC package mounted with the electrical connector shown in FIG. 2.

FIGS. 1-3 illustrate an electrical connector made in accordance with a preferred embodiment of the present invention for interconnecting many IC packages 3 and a printed circuit board (not shown). The electrical connector includes an insulative housing 1 and a plurality of contacts 2 received in the insulative housing 1.

The insulative housing 1 is featured with a planar configuration. A plurality of passageways 10 are formed in the insulative housing 1 to receive the contacts 2. Each contact 2 has one end contacting with the IC package 3 and the other end contacting with the printed circuit board.

The interface of the housing 1 is partitioned into different sectors separated with blanks and arranged in an array and spaced form each other. The contacts 2 are correspondingly divided into a number of groups to be respectively mounted with the interconnecting sector. A plurality of positioning posts are arranged across the interface such that each sector is incorporated with four positioning post 11, 13, and 14 so as to position the IC package 3 therebetween. The positioning posts 11, 13, 14 include three kinds, that is, corner post 14 that has only one positioning member 111, border post 13 that has two positioning members 111, and intersection post 11 that has four positioning members 111. The positioning members 111 of same intersection post 11 or border post 13 are spaced from each other with a gap 114 therebetween so as to provide certain elasticity to the positioning members 111. Each positioning member 111 is formed with an inclined surface 113 at a top end thereof to guide the IC package 3. A latch 112 is formed under the inclined surface 113 to engage with the IC package 3 which is consequently prevented from separating from the electrical connector.

A pair of ear sections 12 is extending at opposite ends of the insulative housing 1 and each ear section 12 is formed with a locating hole 121 for insertion of an alignment pin (not shown) as to facilitate assembly of the electrical connector to the printed circuit board. Each locating hole 12 is equipped with elastic ribs 1211 therein for engaging with the alignment pin.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for receiving more than one IC packages comprising:
    an insulative housing having a planar interface with a plurality of passageways defined therein; and
    a plurality of contacts retained in the passageways respectively and arranged in more than one groups, each group of the contacts being incorporated with positioning members that jointly position the IC package upon the group of the contacts wherein each group of contacts is arranged in a manner of rectangular shape with four corners, each corner being incorporated with one of said positioning members.

2. The electrical connector as claimed in claim 1, wherein the positioning member comprises a latch engaging with the IC package to prevent the IC package from separating from the group of contacts.

3. The electrical connector as claimed in claim 1, wherein the positioning members located adjacent each other for incorporating with different groups of the contacts constitute a positioning post.

4. The electrical connector as claimed in claim 3, wherein the adjacent positioning members are spaced from each other with a gap therebetween as to enable the positioning member to be elastic.

5. An electrical connector comprising: an insulative housing defining a plate with a plurality of passageways extending through opposite top and bottom surfaces thereof, said passageways arranged with a plurality of groups in a matrix format; a plurality of contacts disposed in the corresponding passageways, respectively; and a plurality of positioning members located around each corner of each of said groups for grasping a corresponding electronic package on the housing in alignment with said group of passageways.

6. The electrical connector as claimed in claim 1, wherein the positioning member has an inclined surface for guiding the IC package.

7. The electrical connector as claimed in claim 1, wherein the positioning member is integrally extending upward from the insulative housing.

8. The electrical connector as claimed in claim 1, wherein the insulative housing has a pair of ear sections, each of which is formed with a locating hole.

9. The electrical connector as claimed in claim 8, wherein the locating hole is equipped with elastic ribs therein.

10. An electrical connector for receiving more than one IC packages comprising:
an integrated insulative housing partitioned into a number of interconnecting sectors, which are spaced from each other;
a plurality of contacts retained in each interconnecting sector for electrical connection with an IC package; and
a plurality of positioning posts located among the interconnecting sectors under the condition that each pair of adjacent interconnecting sectors share at least two positioning posts.

11. The electrical connector as claimed in claim 10, wherein the positioning post comprises either one positioning member, or two positioning members, or four positioning members, depending on the location of the positioning post.

12. The electrical connector as claimed in claim 11, wherein the positioning member has a latch engaging with the IC package to prevent the IC package from separating from the interconnecting sector.

13. The electrical connector as claimed in claim 11, wherein the positioning members of same positioning post are spaced from each other with a gap therebetween.

14. The electrical connector as claimed in claim 11, wherein the positioning member has an inclined surface for guiding the IC package.

15. The electrical connector as claimed in claim 10, wherein the positioning post is integrally extending upward from the insulative housing.

16. The electrical connector as claimed in claim 10, wherein the insulative housing has a pair of ear sections, each of which is formed with a locating hole.

17. The electrical connector as claimed in claim 5, wherein each of said positioning members is shared by four adjacent groups of passageways, and each of said positioning members is divided into four parts corresponding to said four groups of passageways, respectively.

18. The electrical connector as claimed in claim 5, wherein a boundary region of each group of passageways is shared with an adjacent group of passageways, and said boundary region is not equipped with any of said passageways so as to allow said positioning members to be formed thereon.

19. The electrical connector as claimed in claim 17, wherein each of said four parts includes a deflectable latch for downwardly pressing a corner of the corresponding electronic package.

* * * * *